United States Patent [19]
Chang

[11] Patent Number: 5,950,081
[45] Date of Patent: Sep. 7, 1999

[54] METHOD OF FABRICATING SEMICONDUCTOR

[75] Inventor: Ming-Lun Chang, Hsinchu, Taiwan

[73] Assignee: Winbond Electronics Corporation, Hsin-Chu, Taiwan

[21] Appl. No.: 09/010,177

[22] Filed: Jan. 21, 1998

[30] Foreign Application Priority Data

Nov. 8, 1997 [TW] Taiwan .................................. 86116671

[51] Int. Cl.⁶ .............................................. H01L 21/8238
[52] U.S. Cl. ........................ 438/227; 438/228; 438/229; 438/233; 438/587; 257/371; 148/DIG. 26
[58] Field of Search .................................... 438/199, 229, 438/228, 233, 587, 227, FOR 168, FOR 216, FOR 217, FOR 218, FOR 346, FOR 351, FOR 787; 257/371; 148/DIG. 26

[56] References Cited

U.S. PATENT DOCUMENTS 5,244,835  9/1993  Hachiya .

*Primary Examiner*—Peter Toby Brown
*Assistant Examiner*—Long Pham
*Attorney, Agent, or Firm*—Rabin & Champagne, P.C.

[57] ABSTRACT

A method of fabricating a semiconductor device. The procedure of fabricating process is performed inversely as the conventional method. Less numbers of photolithography process is performed with the application of selective liquid phase deposition.

14 Claims, 6 Drawing Sheets

1 …

METHOD OF FABRICATING SEMICONDUCTOR

CROSS-REFERENCE TO RELATED APPLICATION

This application claims the priority benefit of Taiwan application Ser. No. 86116671, filed Nov., 8, 1997, the full disclosure of which is incorporated herein by reference.

BACKGROUND OF THE INVENTION

1. Field of the Invention

The invention relates to a method of fabricating a semiconductor device, and more particularly to a method of fabricating a poly-silicon gate with reduced numbers of photolithography processes. Consequently, the problem of gate bridging is improved.

2. Description of the Related Art

Referring to FIG. 1A to FIG. 1D, a cross sectional view of the process of a conventional MOS transistor device is shown. Firstly, as shown in FIG. 1A, a semiconductor substrate 10 having an N-well and a P-well formed therein is provided. A field oxide layer 12 is formed on the semiconductor substrate 10 to isolate the active region. The field oxide layer 12 is formed by local oxidation of silicon (LOCOS), or shallow trench isolation (STI).

The gate 14 is formed as shown in FIG. 1B. Using thermal oxidation, a gate oxide layer 13 is formed. A poly-silicon layer 14 doped with an impurity to enhance the conductivity is deposited. Using first photolithography and etching process, the poly-silicon layer 14 is defined, and the gate 14 is formed.

Referring to FIG. 1D, a second photolithography process is performed. A photo-resist layer 17 is formed to cover the N-well. Using the gate 14 as the mask, implant N-type impurity into the P-well to form source/drain region 18. The photo-resist layer is then removed. The conventional MOS transistor device is formed.

It is shown in the above conventional process for the MOS transistor device that, the formation of source/drain region needs three steps of photolithography process. Whereas the photolithography for the formation of lightly doped drain (LDD) has not been counted. Since the misalignment is inevitable to happen during exposure for photolithography process, the more numbers of photolithography processes are performed, the less the reliable the device is. Though it is not shown in the figure, a gate bridging is very likely to happen in a conventional method due to the misalignment during exposure. Thus, a better process is in need.

SUMMARY OF THE INVENTION

It is therefore an object of the invention to provide a method of a semiconductor device. The numbers of the photolithography are reduced, and the problem of gate bridging is improved.

To achieve these objects and advantages, and in accordance with the purpose of the invention, as embodied and broadly described herein, the invention is directed towards providing a semiconductor substrate having a first type well and a second type well, and a field oxide layer formed therebetween. A first photolithography process, including forming and patterning a first photo-resist layer over the substrate to cover the first type well and a first predetermined gate region on the second type well is performed. A second type impurity is implanted into the exposed second type well to form a first source/drain region. A first silicon oxide layer is formed on the first source/drain region. The first photo-resist layer is then removed to form a first opening on the first predetermined gate region. A second photolithography process is performed, including forming and patterning a second photo-resist layer over the semiconductor substrate to cover the second type well and a second determined gate region on the first well. A first type impurity is implanted into the exposed first type well to form a second source/drain region. A silicon oxide layer is formed on the exposed first type well. The second photo-resist layer is removed to form a second opening on the second predetermined gate region. A gate oxide layer and a conductive layer are formed in the first opening and the second opening. The conductive layer is etched until exposing the first oxide layer and the second oxide layer. Whereas the conductive layer is used as a gate.

It is to be understood that both the foregoing general description and the following detailed description are exemplary and explanatory only and are not restrictive of the invention, as claimed.

DESCRIPTION OF THE PREFERRED EMBODIMENTS

A method of fabricating a semiconductor device is provided in the invention. In the invention, less numbers of photolithography processes are performed, and the possibility of forming gate bridging is lowered. Therefore, the yield and the reliability of the semiconductor device are enhanced.

The procedure of the fabricating processes in the invention is the reverse of the conventional process. In the conventional process of a MOS transistor, the gate is formed before a source/drain region. In the invention, on the contrary, the source/drain region is form before the formation of a gate by using a selective liquid phase deposition (LPD). The detailed process is described as follows with the reference of FIG. 2A to FIG. 2G.

Figure 1A:
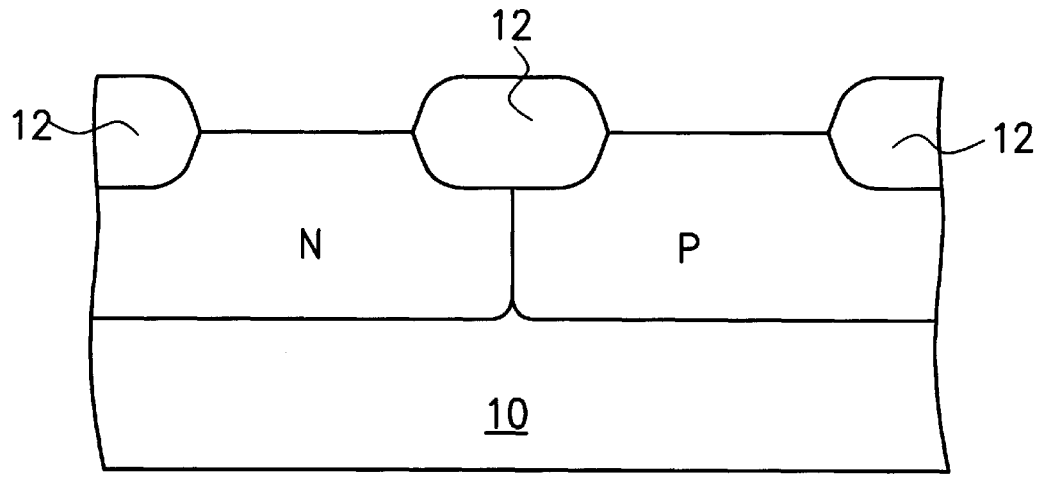
FIG. 1A to FIG. 1D are cross sectional views of a conventional process of fabricating a of a MOS transistor device.
Figure 1B:
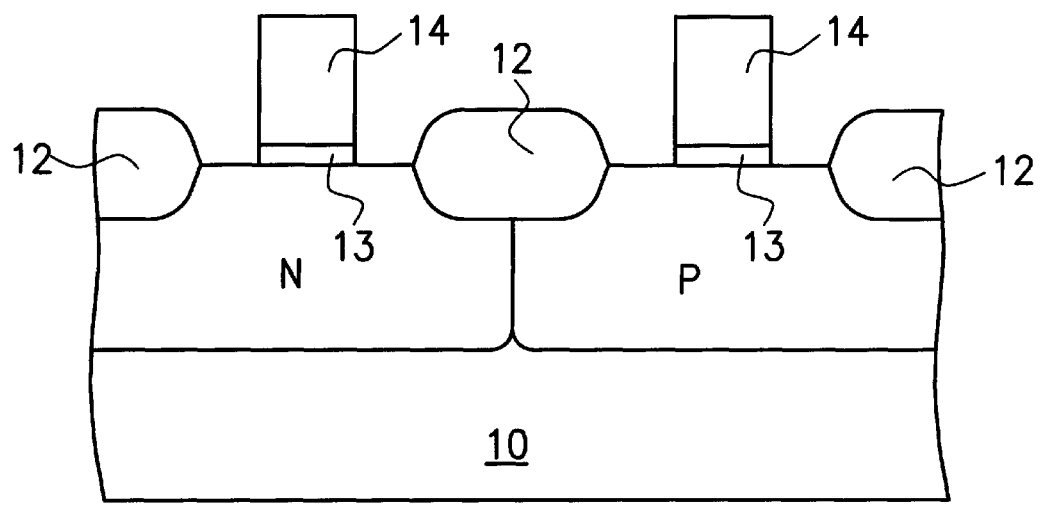
Figure 1C:
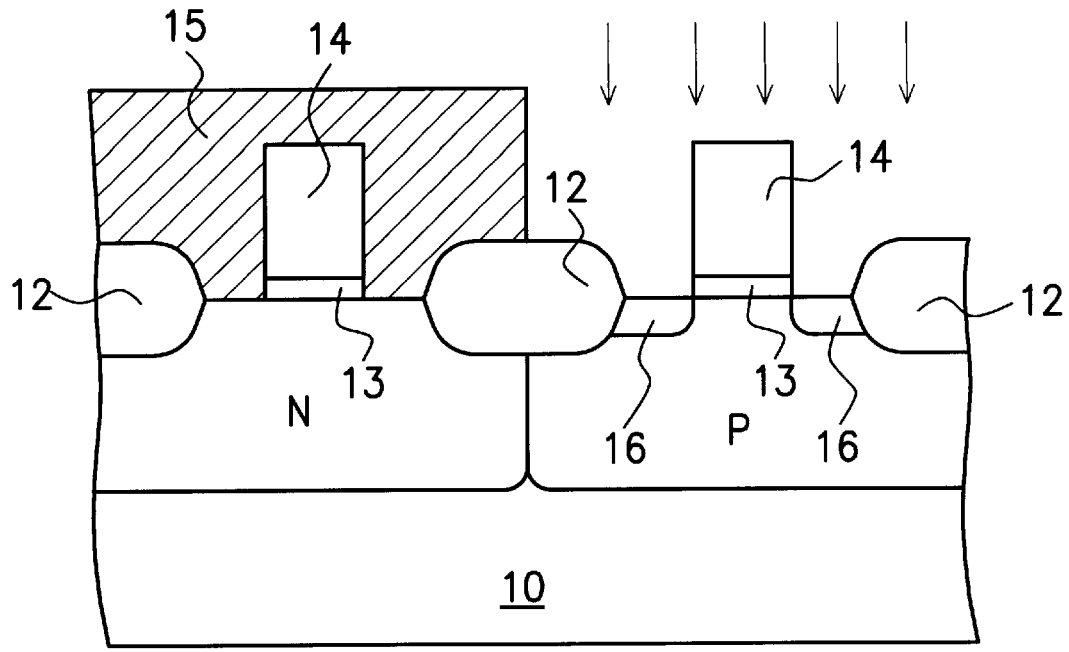
Figure 1D:
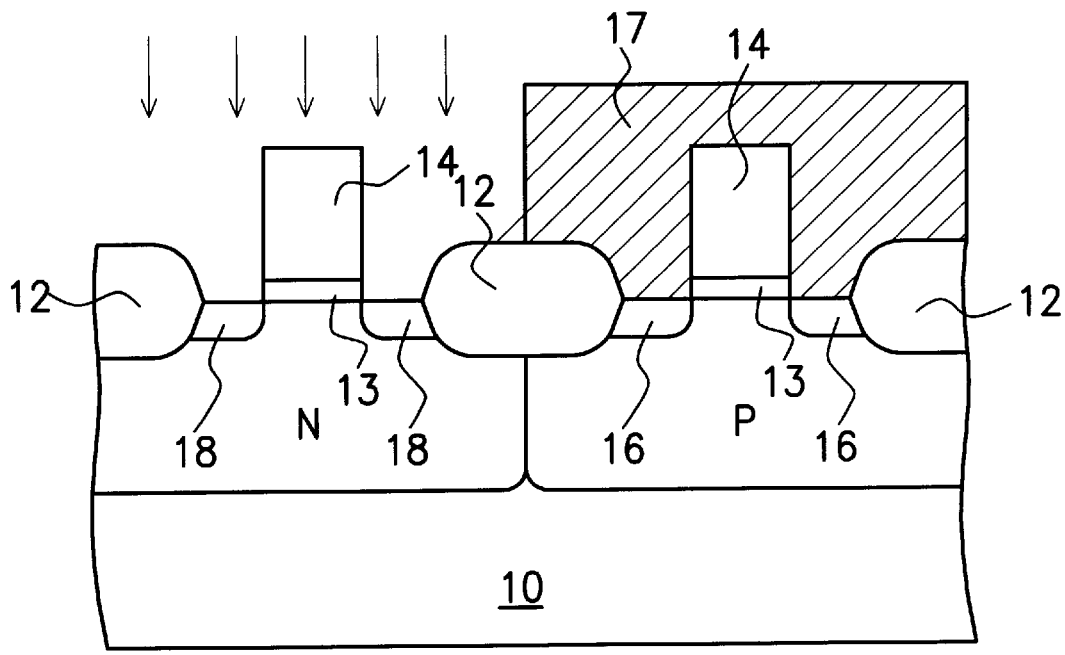
Figure 2A:
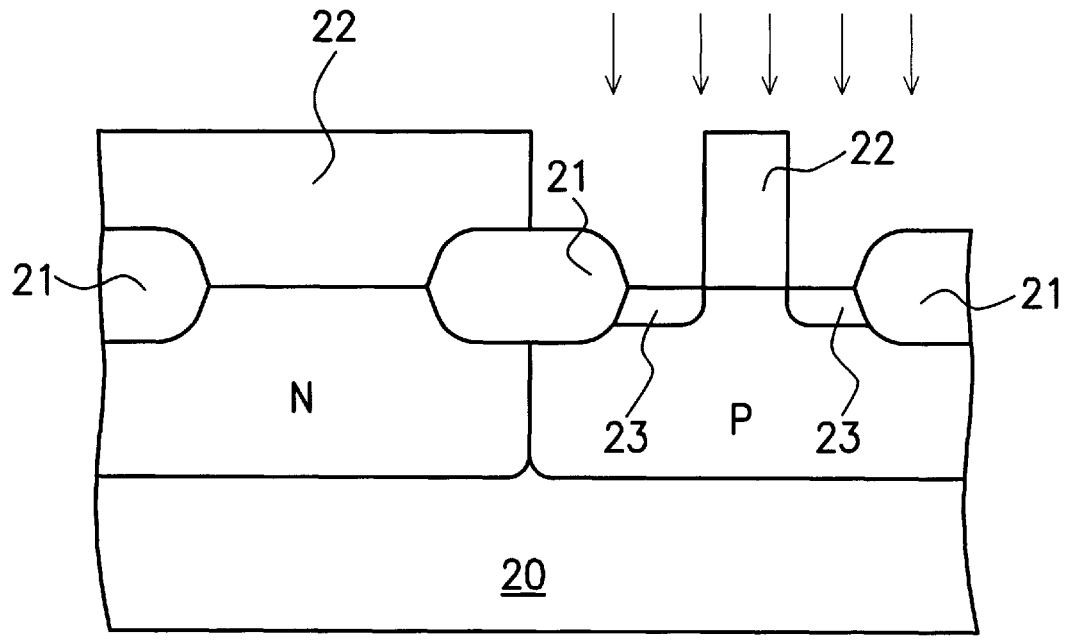
FIG. 2A to FIG. 2G are cross sectional views of the process for fabricating a semiconductor device in a preferred embodiment according to the invention.
Figure 2B:
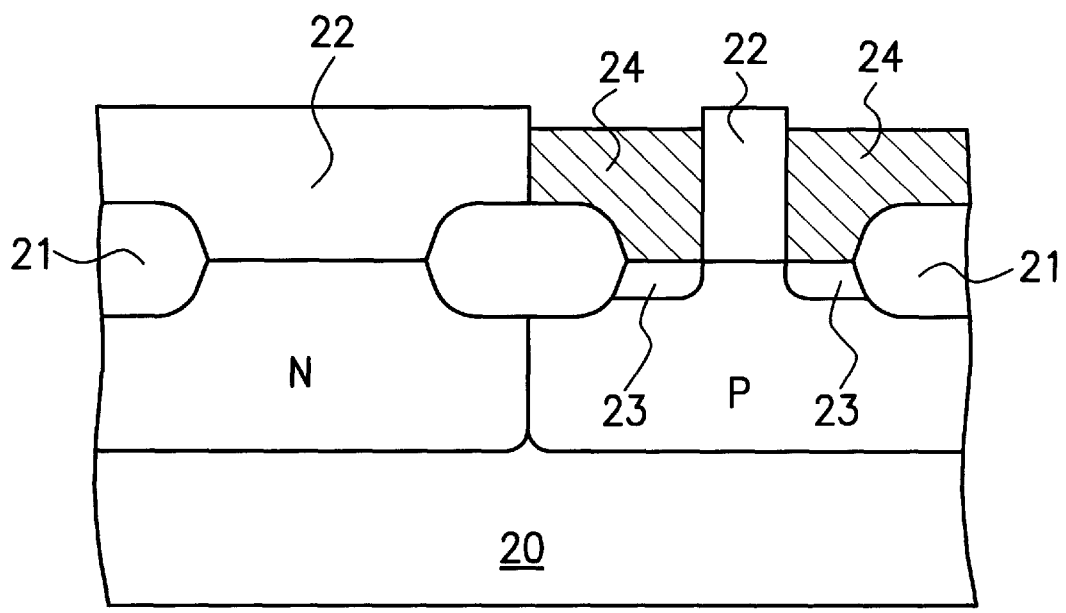

Referring FIG. 2A, a semiconductor substrate 20 with an N-well and a P-well formed therein is provided. An insulation structure, such as a field oxide layer 21 is formed to isolate the active region. The field oxide layer 21 is formed by using local oxidation of silicon, or shallow trench isolation. A first photolithography process is performed, including forming and patterning a first photo-resist layer 22. The N-well and a part of the P-well, that is, a predetermined gate region in the embodiment, are covered by the first photo-resist layer 22. Using ion implantation, an N-type impurity are implanted into the P-well to form a first source/drain region 23.

Referring to 2B, using selective liquid phase deposition, a first silicon oxide layer 24 is formed on the exposed regions, that is, the regions uncovered by the first photo-resist 22. The characteristic of liquid phase deposition is that the deposition is only formed on certain material, for example, only the material with silicon is to be deposited with the first silicon oxide layer 24 in the embodiment. Thus, there is no silicon oxide layer formed over the first photo-resist layer 22. The selective phase deposition thus effectively improves the gate bridging. The first photo-resist 22 is then removed by a conventional method.

Figure 2C:
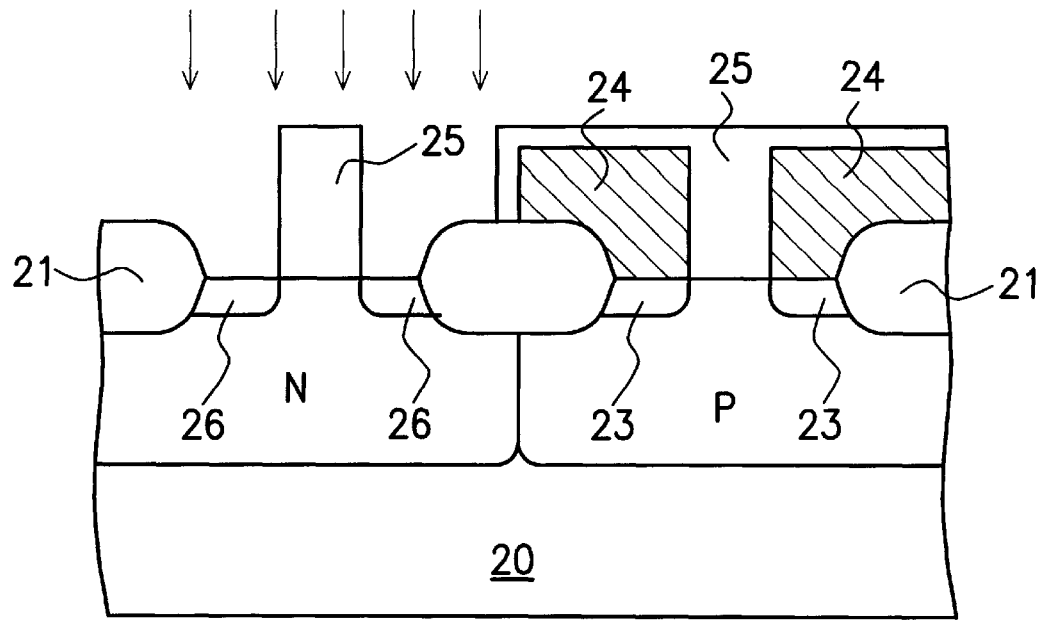
Figure 2D:
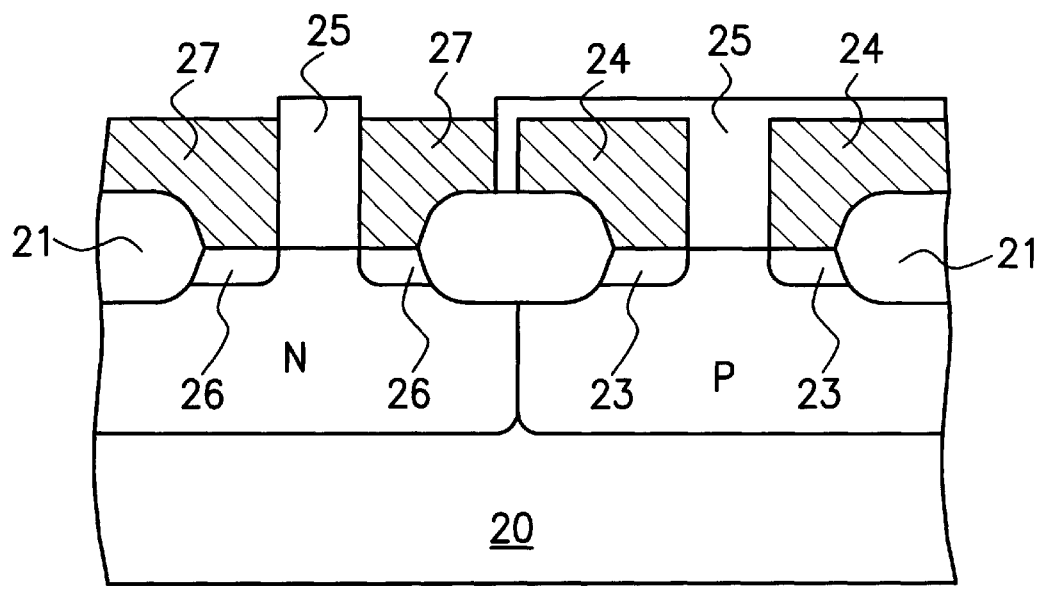

Referring to FIG. 2C, a second photolithography process is performed, including forming and patterning a second photo-resist layer 25. The regions of the P-well and a part of the N-well, that is, a predetermined gate region in the embodiment, are covered by the second photo-resist layer 25. Using ion implantation, a P-type impurity are implanted into the N-well to form a second source/drain region 26.

Referring to 2D, using selective liquid phase deposition, a silicon oxide layer 27 is formed on the region uncovered by the second photo-resist layer 25. Again, only the material with silicon is to be deposited. Thus, the second silicon oxide layer 27 is formed only on the region uncovered by the second photo-resist layer 25.

Figure 2E:
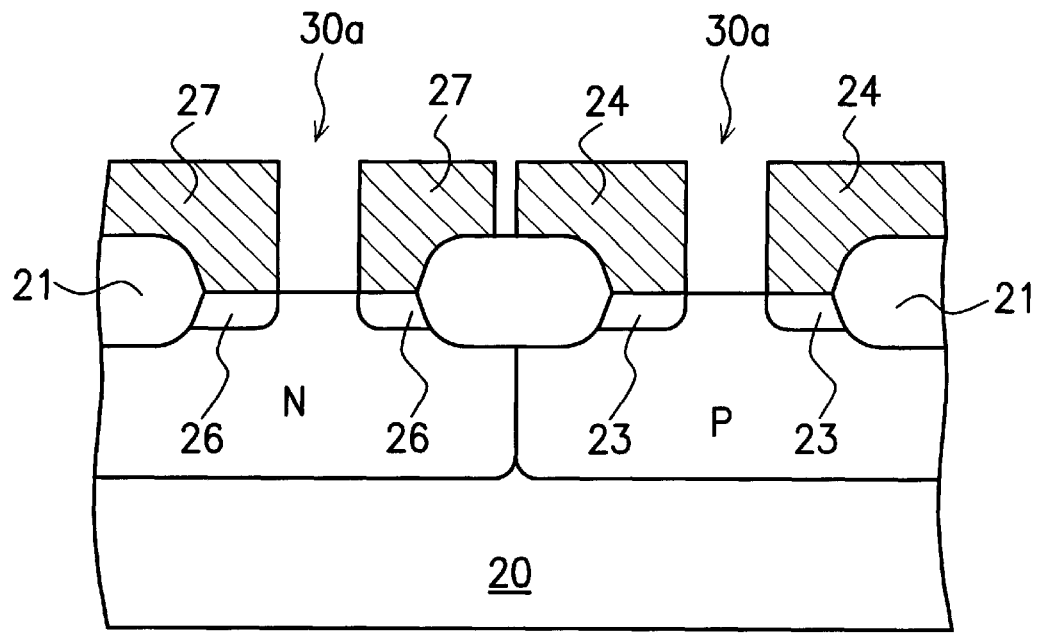
Figure 2F:
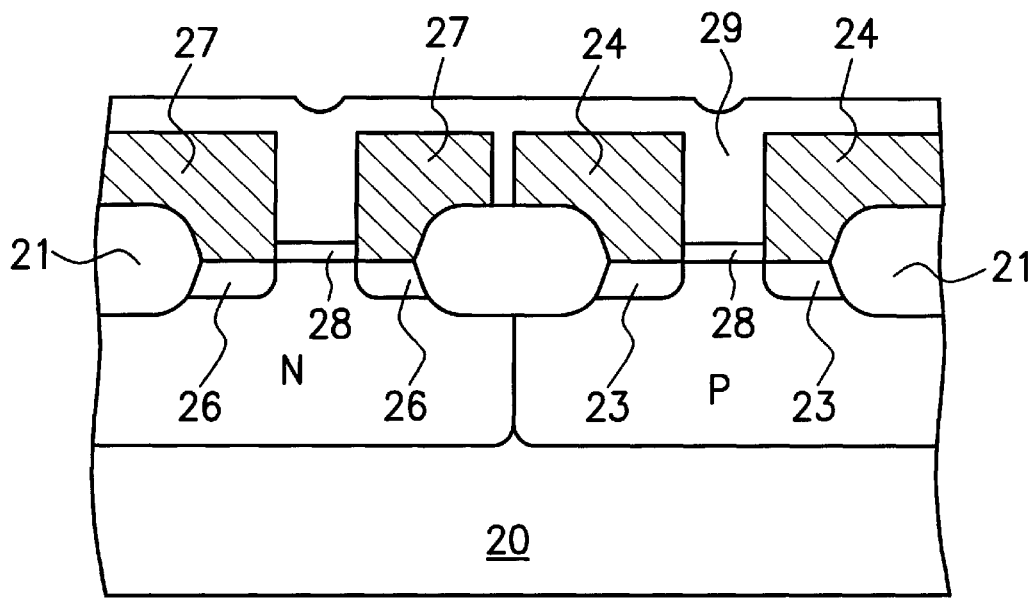

Referring to FIG. 2E, the second photo-resist layer 25 is removed, and thus, openings 30a are formed. A thin gate oxide layer 28 is formed by thermal oxidation on the bottom within the openings 30a. A poly-silicon layer is formed and fills the openings 30a by chemical vapor deposition (CVD). A method of doped in situ or ion implantation is performed to increase the conductivity.

Figure 2G:
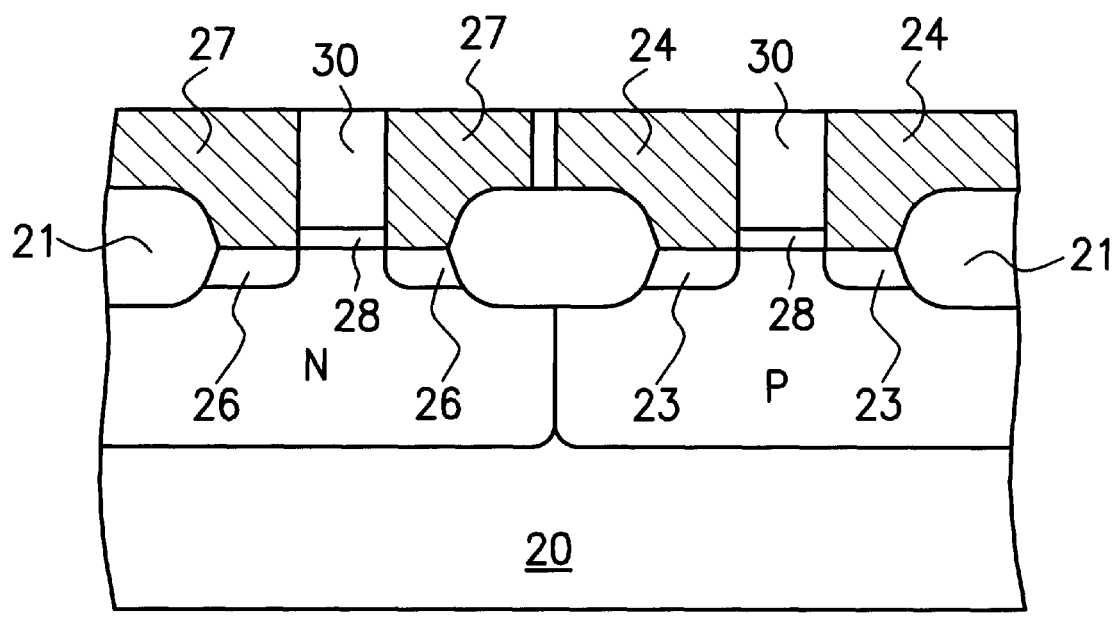

Referring to FIG. 2G, an etching back step or a chemical-mechanical polishing process is performed until the poly-silicon layer 30 is at the same level with the first and the second silicon oxide layers 24 and 27. Therefore, gates 30 are formed.

According to the semiconductor device and the fabricating method of the same described as above, the characteristics of the invention are:

(1) The processing steps from the formation of gate to the formation of source/drain are reduced. Consequently, the possibility of misalignment during exposure is lowered, thus, the reliability of the device is enhanced.

(2) The yield according to the invention is enhanced largely, and the probability of gate bridging is decreased.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a semiconductor device, comprising:
   providing a semiconductor substrate having a first type well and a second type well, and a field oxide layer formed therebetween;
   performing a first photolithography process, including forming and patterning a first photo-resist layer to cover the first type well and a part of the second type well;
   forming a first silicon oxide layer on the exposed second type well;
   removing the first photo-resist layer to form a first opening on the second type well;
   performing a second photolithography process, including forming and patterning a second photo-resist layer on the semiconductor substrate to cover the second type well and a part of the first type well;
   forming a second silicon oxide layer on the exposed first type well;
   removing the second photo-resist layer to form a second opening on the first type well;
   sequentially forming a thin oxide layer and a conductive layer in the first opening and the second opening; and
   etching the conductive layer to expose the first oxide layer and the second oxide layer.

2. The method according to claim 1, wherein the first type well is an N-well and the second type well is a P-well.

3. The method according to claim 1, wherein the first type well is a P-well and the second type well is an N-well.

4. The method according to claim 1, wherein the first silicon oxide layer and the second silicon oxide layer are formed by selective liquid phase deposition.

5. The method according to claim 1, further includes a step for implanting a second type impurity into the first well to form a first source/drain region before the first silicon layer is formed.

6. The method according to claim 1, further includes a step for implanting a first type impurity into the second well to form a second source/drain region before the second silicon layer is formed.

7. The method according to claim 1, wherein the conductive layer is a poly-silicon layer.

8. The method according to claim 7, wherein the poly-silicon layer is a formed by chemical vapour deposition.

9. A method of fabricating a semiconductor device, comprising:
   providing a semiconductor substrate having a first type well and a second type well, and a field oxide layer formed therebetween;
   performing a first photolithography process, including forming and patterning a first photo-resist layer over the substrate to cover the first type well and a first predetermined gate region on the second type well;
   implanting a second type impurity into the exposed second type well to form a first source/drain region;
   forming a first silicon oxide layer on the first source/drain region;
   removing the first photo-resist layer to form a first opening on the first predetermined gate region;
   performing a second photolithography process, including forming and patterning a second photo-resist layer over the semiconductor substrate to cover the second type well and a second determined gate region on the first well;
   implanting a first type impurity into the exposed first type well to form a second source/drain region;
   forming a silicon oxide layer on the exposed first type well;
   removing the second photo-resist layer to form a second opening on the second predetermined gate region;
   forming a gate oxide layer and a conductive layer in the first opening and the second opening; and
   etching the conductive layer until exposing the first oxide layer and the second oxide layer;
   wherein the conductive layer is a gate.

10. The method according to claim 9, wherein the first type well is an N-well and the second type well is a P-well.

11. The method according to claim 9, wherein the first type well is a P-well and the second type well is an N-well.

12. The method according to claim 9, wherein the first silicon oxide layer and the second silicon oxide layer are formed by selective liquid phase deposition.

13. The method according to claim 9, wherein the conductive layer is a poly-silicon layer.

14. The method according to claim 13, wherein the poly-silicon layer is a formed by chemical vapour deposition.

* * * * *